United States Patent [19]

Short

[11] Patent Number: 5,187,667

[45] Date of Patent: Feb. 16, 1993

[54] TACTICAL ROUTE PLANNING METHOD FOR USE IN SIMULATED TACTICAL ENGAGEMENTS

[75] Inventor: Lee O. Short, Brookly Park, Minn.

[73] Assignee: Hughes Simulation Systems, Inc., Arlington, Tex.

[21] Appl. No.: 713,946

[22] Filed: Jun. 12, 1991

[51] Int. Cl.$^5$ .............................................. G06F 15/50
[52] U.S. Cl. .................................... 364/443; 364/444; 73/178 R
[58] Field of Search ........... 364/443, 444, 449, 424.02, 364/436, 461; 73/178 R; 340/988, 990, 995

[56] References Cited

U.S. PATENT DOCUMENTS

| | | | |
|---|---|---|---|
| 4,570,227 | 2/1986 | Tachi et al. ........................ | 340/995 |
| 4,796,189 | 1/1989 | Nakayama et al. ................ | 364/449 |
| 4,827,419 | 5/1989 | Selby, III ........................... | 364/443 |
| 4,962,458 | 10/1990 | Verstraete .......................... | 364/443 |
| 5,038,290 | 8/1991 | Minami .............................. | 364/461 |
| 5,083,256 | 1/1992 | Trovato et al. .................... | 364/424.02 |

Primary Examiner—Gary Chin
Attorney, Agent, or Firm—Terge Gudmestad; M. W. Sales; W. K. Denson-Low

[57] ABSTRACT

A method that may be implemented in software, that selects tactically sound paths for vehicles from an initial position to a goal position across a piece of terrain. The method searches through possible paths before selecting a desired path. It calculates a numerical heuristic to select promising paths to explore. By exploring only a few of the most promising paths, the method maintains high computational efficiency. Specifically, a list of paths is created (12) that begins with a vehicle's initial section and moves to terrain sections surrounding the vehicle. The list of paths is sorted (13) using a minimum estimated total cost value to goal representing estimates of the relative combat values of different pieces of terrain while the vehicle is within engagement range of hostile positions. The total cost value is defined as the path's current cost value plus the estimated cost value from the current position to the goal. Terrain cost values are defined for each of the sections, using a terrain tactical evaluation function. Each of the first three elements of the list of paths is then examined in order (14), and if any of the paths has reached the vehicle's goal position, this path is selected and the method is complete (15, 16). Otherwise, new paths are then generated (17), by moving from the position at the end of the path to each of the adjacent terrain sections. These new paths are added to the list of paths, the original three paths are deleted, and the method (steps 13, 14, 15, 16) is repeated until the goal position is reached.

6 Claims, 2 Drawing Sheets

TACTICAL ROUTE PLANNING METHOD FOR USE IN SIMULATED TACTICAL ENGAGEMENTS

BACKGROUND

The present invention relates generally to simulated terrain navigation procedures and computational methods, and more particularly, to a terrain navigation method that provides for path planning in simulated tactical engagements.

Heuristic search techniques are often used to find "good" paths within a reasonable time period relating to problems for which exhaustive searches are prohibitively expensive. It would be an improvement in the art to have a heuristic search technique that plans vehicle paths for tactical engagements.

SUMMARY OF THE INVENTION

In order to provide for the above-mentioned improvement, the present invention provides a method that is used to determine a good path from a vehicle's initial position to a goal position, which method may be implemented in software. One particular method of path planning is via search techniques which examine many, and sometimes all, possible paths to select the appropriate path(s). The present method employs a search method to simulate tactical route planning. The goal of the method is to find a path to the goal position with high tactical survivability. The primary input to the method is provided by a database representing the terrain to be traversed. More specifically, the present method is outlined below.

There are two inputs to the method: (1) a terrain database divided into sections of uniform size and shape; and (2) a function which represents the vehicle's assigned position in its formation. The output of the method is a path selected for the given vehicle.

The first step is to create a list of paths that comprises a set of paths, each of which begins with the vehicle's initial section and moves to one of the terrain sections surrounding the vehicle. The initial list of paths holds all such possible paths.

The second step is to sort the list of paths in terms of the minimum estimated total cost value to goal. This estimate is known as a heuristic, and such estimates are the basic of all heuristic search techniques. The present method defines the estimated cost to goal of a path as the path's current cost value plus the estimated cost value from the current position to the goal. The present method utilizes terrain cost values representing estimates of the relative combat values of different pieces of terrain while the vehicle is within engagement range of hostile positions. Terrain cost values are defined for each of these sections, using a terrain tactical evaluation function. High cost values represent low survivability, and low cost values represent high survivability.

The third step is to examine in order each of the first three elements of the list of paths. If any of the paths has reached the vehicle's goal position, this path is selected and the method is complete.

The fourth step is to generate new paths from the three paths which were just considered. This is done by moving from the position at the end of the path to each of the adjacent terrain sections. These new paths are added to the list of paths, and the original three paths are deleted from the list of paths.

The second through fourth steps are then repeated until the method ends.

The present method allows the use of heuristic search techniques for vehicle route planning in the simulation of tactical engagements. Heuristic search techniques are used to quickly find efficient paths from an initial position to a goal position. Heuristic search techniques rely on heuristic values which quantify the desirability of a path to a given position. The present search technique relies on a heuristic value that represents the combat desirability of the terrain. A method is obtained that estimates the relative vehicle survivability values of different pieces of terrain while the vehicle is within engagement range of hostile positions. This permits application of the above heuristic search technique to select a vehicle's path in simulated tactical engagements.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

The search method of the present invention is a heuristic search method that is used to quickly find a path from an initial position to a goal position that is good in terms of survival. The search method finds a path that is "good," as measured by minimizing the cost value. For this application, there is no objective value function. Thus, one of the major challenges of applying the basic search method is finding a terrain value function that represents survivability well. The results of tests of the present invention indicate that if an appropriate terrain value function is used, the present search method, or a simple modification of it, may be used to select tactically sound vehicle paths.

Figure 1:
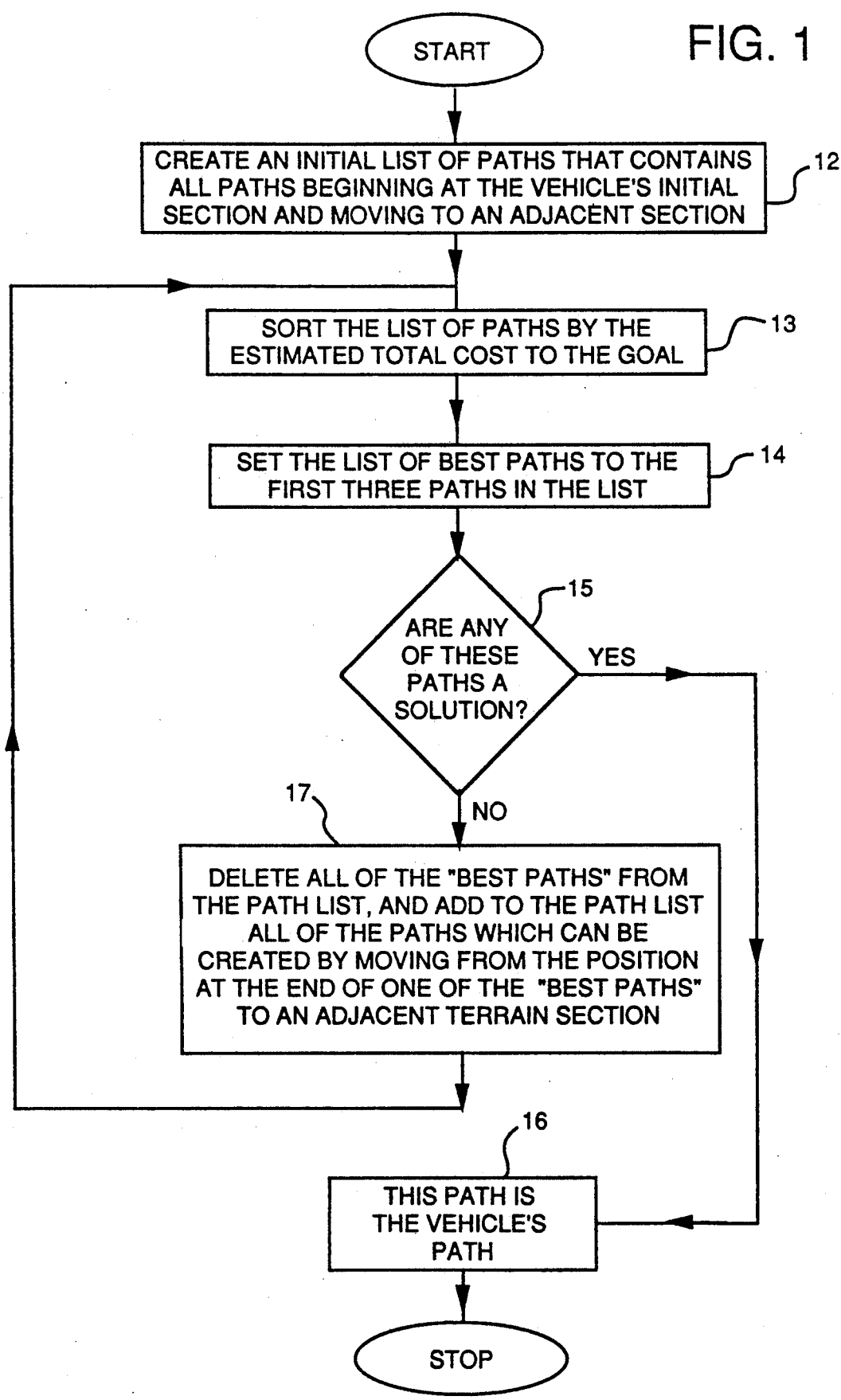
FIG. 1 illustrates a basic method in accordance with the principles of the present invention.

The method used to find a vehicle's path to the goal position comprises the following steps and is shown with reference to FIG. 1. A list of paths is selected that is a set of paths beginning with the vehicle's initial position and moving to each of the terrain sections surrounding this position, with one path to each neighboring terrain section. This is illustrated in box 12. The list of paths is then sorted by the estimated total cost value to goal. This is illustrated in box 13. The estimated cost value to goal of a path is defined as the path's current cost value plus the estimated cost value from its current position to the goal. The estimated cost value remaining is defined as the estimated number of terrain sections on the most direct path from the current position to the goal position, multiplied by the average terrain cost value. The current cost value of a path is defined as the sum of the cost values of the terrain sections defining the segment of the path already selected. The calculation of the individual terrain cost values will be further explained with reference to FIG. 2 and the detailed description below.

Each of the first three elements of the sorted list of paths is examined in order. These paths are the selected paths. This is illustrated in box 14. If any of the selected paths has reached the vehicle's goal position, this path is the solution. This is illustrated in boxes 15 and 16. Otherwise, a new set of paths is created and added to the list, then the three selected paths are deleted. The new set of paths is the set of all paths that can be created by moving from the position at the end of the selected paths to any of the adjacent terrain sections. This is illustrated in box 17. The list of paths is then sorted again and the remaining steps are repeated until the method determines the vehicle's path to the goal To complete the definition of this method, we must define a method which will evaluate terrain based on accepted tactical doctrine.

A terrain evaluation method that is in accord with the tenets of tactical doctrine must use variables which doctrine indicates are significant, and the effects of these variables must be in accord with doctrine. The doctrinal tenets that are applied to the creation of the evaluation method are based on the assumption that the planned vehicle paths are for opposing force vehicles in an assault posture. The tenets employed are: (1) good defensive terrain (terrain with good cover and/or concealment) is desirable and poor defensive terrain (terrain with poor cover and concealment) is undesirable; (2) fields-of-fire is essentially a measure of how much other terrain a position has line-of-sight to; (3) fields-of-fire should be increased for line-of-sight to key terrain (terrain that itself has large fields-of-fire); (4) large fields-of-fire make good defensive terrain more desirable and poor defensive terrain less desirable; and (5) attacking vehicles should maintain formation. Terrain that will disrupt the vehicle's formation should be avoided. These tenets represent factors important to opposing force vehicles in an assault posture, and a different set of tenets would be used to create a cost function for another tactical situation.

Before deriving the terrain evaluation method, the following terms are defined, based on the tenets above. M is the collection (set) of all of terrain in the scenario map, which is divided into a predetermined number of equal-sized sections. The set M is a collection of all such sections; n is the size of the set M; $CN(q)$ is the concealment percentage offered by the section q, defined for all terrain sections q in the map M; $CV(q)$ is the cover percentage offered by the section q, defined for all terrain sections q in the map M; $V(q)$ is the raw terrain value of the section q, defined for all terrain sections q in the map M; $LOS(q,r)$ is the line-of-sight function from section q to section r, and is equal to 1 if there is a clear line-of-sight, and is otherwise equal to 0, defined for all terrain sections q and r in the map M; $F(q)$ is the raw fields-of-fire offered by section q, defined for all terrain sections q in the map M; $F'(q)$ is the fields-of-fire offered by section q, adjusted for fields-of-fire to key terrain, defined for all terrain sections q in the map M; and $V'(q)$ is a terrain value of the section q, adjusted for its fields-of-fire, defined for all terrain sections q in the map M. The function $D(q,t)$ represents the distance between the terrain section q and the vechicle's assigned terrain section at time t, defined for all terrain sections in the map M. The value which we must derive is $C(q,t)$, the final adjusted terrain cost of the section q, defined for all terrain sections q in the map M.

Figure 2:
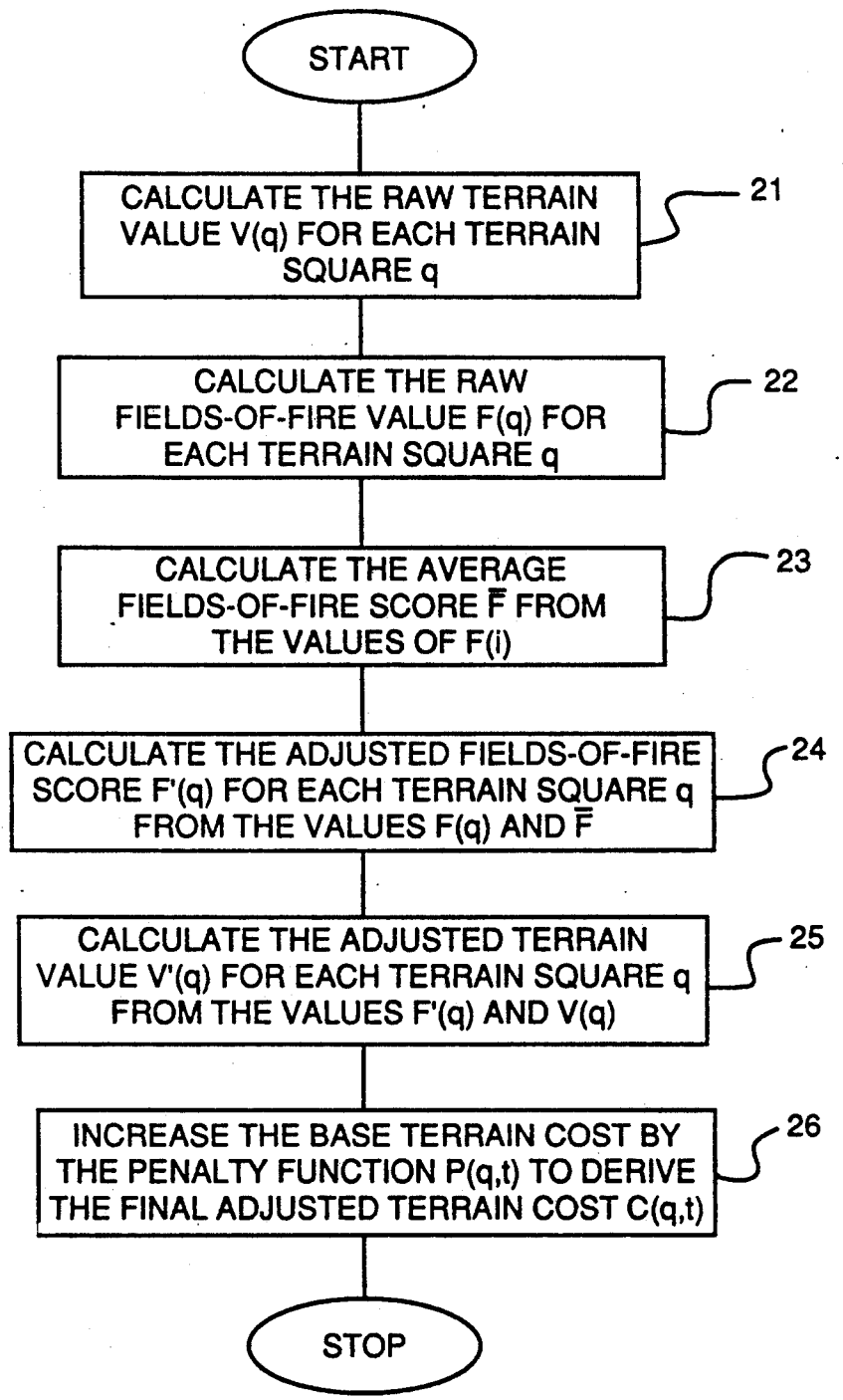
FIG. 2 illustrates a method used to calculate the heuristic cost values.

A derivation of the method for calculating terrain costs is presented below, and with reference to FIG. 2, which gives an overview of the method.

The first step in determining terrain costs, found in box 21, is to determine a raw terrain cost for each terrain section. $V(q)$, the raw terrain cost of the section q, is found by subtracting the concealment and cover percentages from 0 and then dividing by 50. The constant 2.0 is then added to this value, leaving the range of possible values from −2.0 to +2.0. Poor defensive terrain will have positive values, and good defensive terrain will have negative values. Given the definitions above, this calculation is expressed by the equation:

$$V(q) = 2.0 - \frac{CN(q) + CV(q)}{50} \quad (1)$$

The next step is to determine the raw fields-of-fire score for the terrain section. Box 22 corresponds to this step. A simple measure of fields-of-fire is the number of other terrain sections which may be seen from the current sections. If $F(q)$ is the raw fields-of-fire value for the terrain section, this counting operation may be expressed as:

$$F(q) = \sum_{r/r \in M, r \neq q} LOS(q,r) \quad (2)$$

Next we calculate the average raw fields-of-fire score, $\bar{F}$, which is simply the arithmetic mean of the values of $F(q)$. This is illustrated by box 23. The calculation can be expressed as:

$$\bar{F} = \sum_{q \in M} \frac{F(q)}{n} \quad (3)$$

We then calculate $F'(q)$, the fields-of-fire value offered by section q, adjusted for fields-of-fire to key terrain. This is illustrated by box 24. The value is computed by a weighted count of all the other terrain which the terrain section in question has line-of-sight to. Each piece of terrain is weighted by a factor of half of the average raw field-of-fire score plus its own raw fields-of-fire score. This computation is shown by the equation:

$$F'(q) = \sum_{r/r \in M, r \neq q} LOS(q,r) \cdot (F(r) + \bar{F}/2) \quad (4)$$

The terrain cost of the section q, adjusted for its fields-of-fire, can now be calculated. This corresponds to box 25. The adjusted terrain cost, $V'(q)$, is equal to the section's raw terrain cost multiplied by the section's adjusted fields-of-fire score.

$$V'(q) = V(q)F'(q) \quad (5)$$

The effect of a large adjusted fields-of-fire score is to make good terrain even more desirable by adjusting its terrain cost to a negative number of greater magnitude. Poor defensive terrain that has a large adjusted fields-of-fire score has an increased terrain cost.

The final intrinsic cost of the terrain has thus been created. There is only one more effect to be considered, namely, the effect of the terrain on the formation of the attacking vehicles. Vehicles in attack formation are found in a line formation. The advance is usually very slow, due in large measure to the difficulty of maintaining this formation. The formation is defined by laterally divided lanes in which each unit is to advance. Thus, a battalion is assigned a lane in which to advance, and to each of its sides is the marching lane for another battalion. Battalions are not to encroach upon the territory of their neighboring battalions. In a similar vein, each battalion divides its zone of advance into three company zones. Each company further defines platoon march zones. The units stay toward the center of their march zones. Any terrain section that requires a vehicle to stray from its line of advance is less attractive to that vehicle. This is reflected in the cost score by increasing the terrain value of each section by a penalty function.

There are two factors which effect the value of the penalty function. These are: (1) the width of the platoon's assigned lane of advance, and (2) the distance which the terrain section is from the vehicle's assigned position. The general effects of these three variables is as follows. A wide lane of advance allows the individuals vehicles more leeway. A large value for the width of a platoon's assigned lane of advance, $S_p$, should reduce the effects of the vehicle straying from its position. The farther a vehicle is from its assigned position, the more it should be penalized. As an assault formation is constantly moving forward, the distance that a given terrain section is from a vehicle's assigned position will vary with time. Thus, the distance between a vehicle's assigned position and the terrain section q is $D(q,t)$ where t represents time.

This penalty function has a low value until a vehicle begins to stray from its position by more than the intervehicular spacing, at which point it begins to rise sharply. The following function has these properties:

$$P(q) = \exp\left(\frac{D(q,t) - 0.35\, S_p}{0.35\, S_p}\right) \quad (6)$$

The value of this penalty function is always positive, and it reaches a value of $+1.0$ when the vehicle has strayed laterally a distance of $0.35\, S_p$. After this point the value begins to rise quickly.

Adding this penalty function to the final intrinsic terrain cost, represented in box 26, provides us with a final adjusted terrain cost of $$\begin{aligned} C(q) &= V'(q) + P(q) \\ &= V(q)F(q) + \exp\left(\frac{D(q,t) - 0.35\, S_p}{0.35\, S_p}\right) \end{aligned} \quad (7)$$

This completes the calculation of the terrain cost value and thus completes the search method.

The present method comprises a search technique for vehicle route planning in the simulation of tactical engagements. This technique can be used to quickly find efficient paths from an initial state (the vehicle's initial position) to a goal state (the vehicle's goal or target). The present search technique relies on a numerical function that estimates the value of the various nodes. A terrain cost function is derived that estimates the relative combat values of different pieces of terrain while the vehicle is within engagement range of hostile positions. This permits application of heuristic search, that provides a method of quickly selecting a good path from among a large number of choices. A heuristic search may then be used to select vehicles' paths in simulated tactical engagements.

Thus there has been described a new and improved searching technique for use in simulated tactical engagements. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A computer-implemented method of providing for terrain evaluation and searching in simulated tactical engagements that employs a terrain database, and which determines an optimum path from a predetermined location in the terrain to a goal position, said method comprising the steps of:

dividing the terrain database into sections having uniform size and shape;

calculating a terrain cost value for each of the sections using a predefined terrain tactical evaluation function that corresponds to an estimate of the relative cost value of the terrain contained within each section;

selecting a set of paths starting with the predetermined location and ending with each of the terrain sections surrounding the predetermined location;

sorting the selected set of paths from the predetermined location to the goal position in terms of said terrain cost value;

processing each of a plurality of paths in the set of paths to determine if one of the paths has reached the goal position, and if the the goal position has been reached, computing a total cost value from the predetermined location to the goal position, and terminating the method;

if the goal position is not reached, generating a plurality of new paths by starting from the position at the end of a selected plurality of best paths to any of their adjacent terrain sections;

adding the plurality of new paths to the set of paths to create a new set of paths, and deleting the original path from the new set of paths; and sorting the new set of paths and continuing the above steps until the optimum path from the predetermined location to the goal position is determined.

2. The method of claim 1 wherein the terrain tactical evaluation function is defined by the equation $$V_{final}(q) = V'(q) + P(q) = V(q)F(q) + \exp\left(\frac{D(q,t) - 0.35\, S_p}{0.35\, S_p}\right)$$

wherein $$V(q) = 2.0 - \left(\frac{CN(q) + CV(q)}{50}\right)$$

$$F(q) = \sum_{r/r \in M, r \neq q} LOS(q,r)$$

$$\bar{F} = \sum_{q \in M} \frac{F(q)}{n}$$

$$F(q) = \sum_{r/r \in M, r \neq q} LOS(q,r) \cdot (F(r) + \bar{F}/2) \text{ and}$$

$$V'(q) = V(q)\, F(q)$$

$$P(q) = \exp\left(\frac{D(q,t) - 0.35\, S_V}{0.35\, S_V}\right),$$

and wherein M is the collection of all of the terrain in a scenario map M, which is divided into a number of equal-sized sections; the map M is the collection of all such sections; n is the size of the map M; CN(q) is the concealment percentage offered by the section q, defined for all terrain sections q in the map M; CV(q) is the cover percentage offered by the section q, defined for all terrain sections q in the map M; V(q) is the raw terrain value of the section q, defined for all terrain sections q in the map M; LOS(q,r) is the line-of-sight function from section q to section r, and equal to 1 if there is a clear line-of-sight, and is otherwise 0, defined for all terrain sections q and r in the map M; F(q) is the raw fields-of-fire offered by section q, defined for all terrain sections q in the map M; F'(q) is the fields-of-fire offered by section q, adjusted for fields-of-fire to key terrain, defined for all terrain sections q in the map M; and V'(q) is the terrain value of the section q, adjusted for its fields-of-fire, defined for all terrain sections q in the map M.

3. A computer-implemented method of providing for terrain evaluation and searching in simulated tactical engagements that employs a terrain database, and which determines an optimum path from a predetermined vehicle location in the terrain to a goal position, said method comprising the steps of:

dividing the terrain database into sections of uniform size and shape;

creating a list of paths that comprises a set of paths, each of which begins with a vehicle's initial section and moves to one of the terrain sections surrounding the vehicle;

calculating an estimated cost value to reach the goal position for each path, which is defined as each path's current cost value plus an estimated remaining cost value from the current position to the goal position, and wherein said estimated cost value corresponds to an estimate of a relative combat value of each different piece of terrain while the vehicle is within engagement range of hostile positions;

sorting the list of paths in terms of said estimated cost value to the goal position;

examining in order each of the first three paths of the list of paths;

if one of the first three paths has reached the vehicle's goal position, said one path is selected as the optimum path, and the method is terminated;

generating new paths from the three paths which were just considered, by moving from the position at the end of a selected one of the three paths to each respectively adjacent terrain section;

adding said new paths to the list of paths;

continuing the above steps until the vehicle's goal position is reached and then terminating the method.

4. The method of claim 3 wherein the terrain tactical evaluation function is defined by the equation $$V_{final}(q) = V'(q) + P(q) = V(q)F(q) + \exp\left(\frac{D(q,t) - 0.35 S_p}{0.35 S_p}\right)$$

wherein $$V(q) = 2.0 - \left(\frac{CN(q) + CV(q)}{50}\right)$$

$$F(q) = \sum_{r/r\epsilon M, r\neq q} LOS(q,r)$$

$$F = \sum_{q\epsilon M} \frac{F(q)}{n}$$

$$F'(q) = \sum_{r/r\epsilon M, r\neq q} LOS(q,r) \cdot (F(r) + \bar{F}/2) \text{ and}$$

$$V'(q) = V(q) F(q)$$

$$P(q) = \exp\left(\frac{D(q,t) - 0.35 S_V}{0.35 S_V}\right),$$

and wherein M is the collection of all of the terrain in a scenario map M, which is divided into a number of equal-sized sections; the map M is the collection of all such sections; n is the size of the map M; CN(q) is the concealment percentage offered by the section q, defined for all terrain sections q in the map M; CV(q) is the cover percentage offered by the section q, defined for all terrain sections q in the map M; V(q) is the raw terrain value of the section q, defined for all terrain sections q in the map M; LOS(q,r) is the line-of-sight function from section q to section r, and equal to 1 if there is a clear line-of-sight, and is otherwise 0, defined for all terrain sections q and r in the map M; F(q) is the raw fields-of-fire offered by section q, defined for all terrain sections q in the map M; F(q) is the fields-of-fire offered by section q, adjusted for fields-of-fire to key terrain, defined for all terrain sections q in the map M; and V'(q) is the terrain value of the section q, adjusted for its fields-of-fire, defined for all terrain sections q in the map M.

5. A computer-implemented method of providing for terrain evaluation and searching in simulated tactical engagements that employs a terrain database, and which determines an optimum path to be followed by a vehicle from a predetermined location in the terrain to a goal position, said method comprising the steps of:

dividing the terrain database into sections of uniform size and shape;

calculating terrain cost values representative of estimates of the relative combat values of different pieces of terrain while the vehicle is within engagement range of hostile positions for each of said sections, using a predefined terrain tactical evaluation function;

calculating, for each of the sections, an adjustment for said terrain cost values;

selecting a list of paths beginning with the vehicle's initial section and ending at each of the terrain sections surrounding the vehicle;

calculating an estimated cost value to reach the goal position for each path, which is defined as each path's current cost value plus an estimated remaining cost value from the current position to the goal position, wherein the estimated remaining cost value is defined as the number of remaining terrain sections times the average terrain cost value, and wherein the current cost value of a path is defined as the sum of the adjusted terrain cost values of the terrain sections defining the paths;

sorting the list of paths in terms of said estimated cost value to reach the goal position;

processing in order each of the first three paths of the list of paths, and if one of the first three paths has reached the vehicle's goal position, computing a total cost value from the predetermined location to the goal position, and terminating the method;

if the goal position is not reached, for each of the three best paths, generating new paths which can be created by moving from the position at the end of each of the three best paths to their respectively adjacent terrain sections;

adding said new paths to the list of paths, and deleting the original path from the list of paths; and sorting the list of paths and continuing the above steps until the method determines the vehicle's path to the goal position.

6. The method of claim 5 wherein the terrain tactical evaluation function is defined by the equation $$V_{final}(q) = V'(q) + F'(q) = V(q)F'(q) + \exp\left(\frac{D(q,t) - 0.35 S_p}{0.35 S_p}\right)$$

wherein $$V(q) = 2.0 - \left(\frac{CN(q) + CV(q)}{50}\right)$$

$$F(q) = \sum_{r/r \epsilon M, r \neq q} LOS(q,r)$$

$$F = \sum_{q \epsilon M} \frac{F(q)}{n}$$

$$F'(q) = \sum_{r/r \epsilon M, r \neq q} LOS(q,r) \cdot (F(r) + F/2) \text{ and}$$

$$V'(q) = V(q) \ F'(q)$$

$$P(q) = \exp\left(\frac{D(q,t) - 0.35 S_V}{0.35 S_V}\right),$$

and wherein M is the collection of all of the terrain in a scenario map M, which is divided into a number of equal-sized sections; the map M is the collection of all such sections; n is the size of the map M; CN(q) is the concealment percentage offered by the section q, defined for all terrain sections q in the map M; CV(q) is the cover percentage offered by the section q, defined for all terrain sections q in the map M; V(q) is the raw terrain value of the section q, defined for all terrain sections q in the map M; LOS(q,r) is the line-of-sight function from section q to section r, and equal to 1 if there is a clear line-of-sight, and is otherwise 0, defined for all terrain sections q and r in the map M; F(q) is the raw fields-of-fire offered by section q, defined for all terrain sections q in the map M; F'(q) is the fields-of-fire offered by section q, adjusted for fields-of-fire to key terrain, defined for all terrain sections q in the map M; and V'(q) is the terrain value of the section q, adjusted for its fields-of-fire, defined for all terrain sections q in the map M.

* * * * *